(12) United States Patent
Kawahito

(10) Patent No.: US 7,842,978 B2
(45) Date of Patent: Nov. 30, 2010

(54) IMAGING DEVICE BY BURIED PHOTODIODE STRUCTURE

(75) Inventor: Shoji Kawahito, Hamamatsu (JP)

(73) Assignee: National University Corporation Shizuoka University, Shizuoka-shi (JP)

( * ) Notice: Subject to any disclaimer, the term of this patent is extended or adjusted under 35 U.S.C. 154(b) by 445 days.

(21) Appl. No.: 11/577,546

(22) PCT Filed: Oct. 18, 2005

(86) PCT No.: PCT/JP2005/019464

§ 371 (c)(1),
(2), (4) Date: Sep. 28, 2007

(87) PCT Pub. No.: WO2006/043697

PCT Pub. Date: Apr. 27, 2006

(65) Prior Publication Data

US 2008/0277700 A1 Nov. 13, 2008

(30) Foreign Application Priority Data

Oct. 19, 2004 (JP) .............................. 2004-303983

(51) Int. Cl.
*H01L 31/113* (2006.01)
(52) U.S. Cl. ...................... 257/222; 257/225; 257/233; 257/E27.133
(58) Field of Classification Search ................ 257/222, 257/225, 233, E27.133
See application file for complete search history.

(56) References Cited

U.S. PATENT DOCUMENTS

| | | | | |
|---|---|---|---|---|
| 4,974,043 A | * | 11/1990 | Stevens | 257/234 |
| 5,043,783 A | * | 8/1991 | Matsumoto et al. | 257/461 |
| 5,977,576 A | * | 11/1999 | Hamasaki | 257/292 |
| 6,188,093 B1 | * | 2/2001 | Isogai et al. | 257/230 |
| 2005/0269606 A1 | * | 12/2005 | Mouli | 257/292 |

(Continued)

FOREIGN PATENT DOCUMENTS

JP   6 13597   1/1994

(Continued)

OTHER PUBLICATIONS

U.S. Appl. No. 12/516,635, filed May 28, 2009, Kawahito.

(Continued)

*Primary Examiner*—Eugene Lee
(74) *Attorney, Agent, or Firm*—Oblon, Spivak, McClelland, Maier & Neustadt, L.L.P.

(57) ABSTRACT

An n-type region as a charge storage region of a photodiode is buried in a substrate. The interface between silicon and a silicon oxide film is covered with a high concentration p-layer and a lower concentration p-layer is formed only in the portion immediately below a floating electrode for signal extraction. Electrons generated by light are stored in the charge storage region, thereby changing the potential of the portion of the p-layer at the surface of the semiconductor region. The change is transmitted through a thin insulating film to the floating electrode by capacitive coupling and read out by a buffer transistor. Initialization of charges is executed by adding a positive high voltage to the gate electrode of a first transfer transistor such that the electrons stored in the charge storage region are transferred to the $n^+$ region and generation of reset noise is protected.

4 Claims, 8 Drawing Sheets

U.S. PATENT DOCUMENTS

2006/0103747 A1* 5/2006 Rhodes ................. 348/300
2006/0255382 A1* 11/2006 Rhodes ................. 257/292

FOREIGN PATENT DOCUMENTS

| JP | 8 214218 | 8/1996 |
| JP | 8 335688 | 12/1996 |
| JP | 10 209422 | 8/1998 |
| JP | 2000 312024 | 11/2000 |

OTHER PUBLICATIONS

U.S. Appl. No. 12/065,156, filed Feb. 28, 2008, Kawahito, et al.
U.S. Appl. No. 12/065,158, filed Feb. 28, 2008, Kawahito, et al.

* cited by examiner (a)

(b)

(a)

(b)

IMAGING DEVICE BY BURIED PHOTODIODE STRUCTURE

BACKGROUND OF THE INVENTION

1. Field of the Invention

The present invention relates to a structure of a pixel that implements an image sensor, which has low noise and small dark current and high sensitivity, and more particularly pertains to an image sensor manufactured by adding several steps to a CMOS integrated circuit fabrication procedure.

2. Background-Art

CMOS image sensors are manufactured by adding several steps for achieving a structure of photoelectric conversion to fabrication procedure of CMOS integrated circuits. There are a passive pixel architecture that directly transfers charges generated by light to a circuit provided outside a pixel array and an active pixel architecture that transfers a voltage change associated with the storage of signal charges through a transistor provided inside a pixel to a circuit outside a pixel array. The active pixel architecture can achieve lower noise and higher sensitivity performances. In the active pixel architecture, there are a first approach that reads out a potential change in a photodiode associated with the storage of charges directly through a transistor, and a second approach, in which charges are transferred firstly to a floating diffusion inside a pixel from a photodiode and a potential change in the floating diffusion is read out through a transistor.

The example of the second approach is disclosed in a following document:

1) Teh-Hsuang Lee et al., "Active Pixel Sensor Integrated with a Pinned Photodiode" Japanese Laid Open Patent Application (JP-1996-335688A)

An example of the pixel structure and circuit pertaining to the second approach is shown in FIG. 1.

A p-type semiconductor silicon is used as a substrate (1), an n-type region as a charge; storage region (2) is formed in a portion serving as a photodiode, and on the surface thereof, a p-layer (3) of high concentration, or a p-type region having the same polarity as the substrate, is further formed. Consequently, a portion where electrons are stored is buried inside the semiconductor, and the surface is filled with carriers of the opposite polarity (holes in the case that the electrons are stored), and the dark current is consequently made very small.

Also, because the charge storage region (2) is connected to a transferring transistor, if the potential of a control signal TX of its gate electrode (6') is made high so that a gate is opened, the charges stored in an n-type floating diffusion (FD) (15) are perfectly transferred. This methodology removes an afterimage caused by residual charges and resolves the generation of noises, and together with the combination of the charge transfer and the read out operation to a peripheral circuit, a correlative double sampling process is executed thereby canceling a reset noise.

For achieving read out operation of the potential, a gate of a buffer transistor (7) is connected to the floating diffusion (15), and a high voltage is applied to the line S so that a pixel select transistor (3) can conduct. Furthermore, a buffer transistor (7) and a current supply transistor (9) provided around the pixel array implements a source follower circuit, and the potential of the floating diffusion is read out by the source follower circuit and is transferred to an output.

Reference numeral 4 of FIG. 1 indicates an insulator (dielectric) formed of silicon oxide film, reference numeral 5 indicates a resetting n⁺ region, and reference numeral 6 indicates a reset gate electrode.

Such pixel configuration is widely used, because the CMOS image sensor having the low dark current, random noise and high sensitivity can be achieved. However, in such charge transfer methodology, the portions where the charges are stored are required to be allocated at two portions, or at the photodiode unit and the floating diffusion. Thus, in association with the miniaturization of a pixel size, the treatable signal charge amount is reduced, and it becomes difficult to make the signal amplitude in the floating diffusion high. Hence, it is feared that a dynamic range is decreased in association with a drop in a supply voltage.

On the other hand, the first approach is the methodology that does not carry out the charge transfer, and this is superior to the charge transferring method with regard to the treatable charge amount. However, in the first approach, the reset noise becomes the main factor of the random noise, and the noise level becomes great, and the photodiode cannot be formed with the buried structure, and the dark current becomes also great. As a structure to decrease this dark current, a methodology that partially forms a p-type semiconductor on a surface is disclosed in a following document:

2) Teh-Hsuang Lee et al., "Partially Pinned Photodiode for Solid State Image Sensors", Japanese Laid Open Patent Application (JP 1998-209422A).

FIG. 2 shows an example of this structure. In the structure as shown in FIG. 2, since the potential of an n-type region serving as the charge storage region (2) of the photodiode is connected to a gate of a MOS-type buffer transistor (7), a part of the n-layer of the photodiode is brought into contact with the interface between the semiconductor and a silicon oxide film (4), and the dark current becomes great as compared with the case that the charge storage region (2) is perfectly buried.

REFERENCE DOCUMENT LIST

[Patent Document 1] Japanese Laid Open Patent Application (JP 1998-335688A)

[Patent Document 2] Japanese Laid Open Patent Application (JP 1998-209422A)

SUMMARY OF THE INVENTION

Even in the structure of the conventional methodology, in which charge transfer is not carried out, when charges stored in the photodiode are initialized, if the n-type region can be perfectly depleted and all electrons can be transiently extracted into the n-type region, which is connected to a resetting power supply VR, the reset noise can be avoided from being generated. However, in the structure of FIG. 2, the n-layer is connected to a metallic wiring. Thus, donor impurities of high concentration are required to be doped into the n-layer connected to the metallic wiring so as to provide a layer where the electron concentration is very high. Because of the existence of the n-type layer of very high concentration, the perfect depletion of the n-type layer cannot be achieved, which results in the generation of the reset noise.

The present invention provides a pixel structure that can jointly solve the problems in the conventional structure, and can achieve the performances such as the sufficient storage signal amount, the reset noise removal, the low dark current and the high sensitivity.

Figure 1:
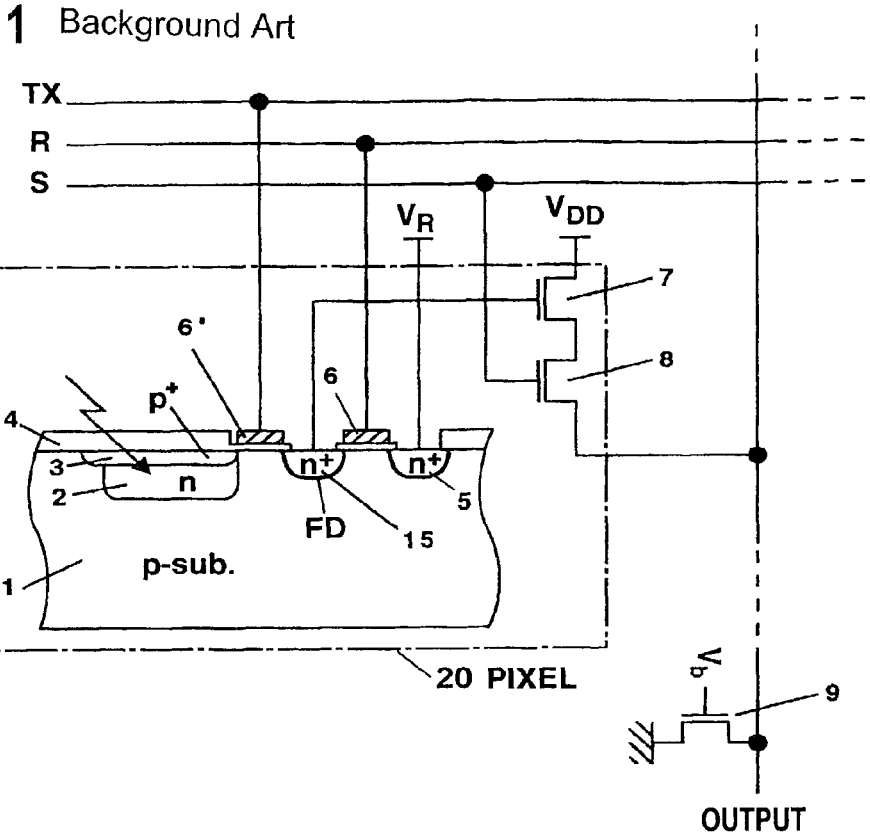
FIG. 1 is a view showing a charge transferring type pixel circuit (conventional technique 1) using a buried photodiode.
Figure 2:
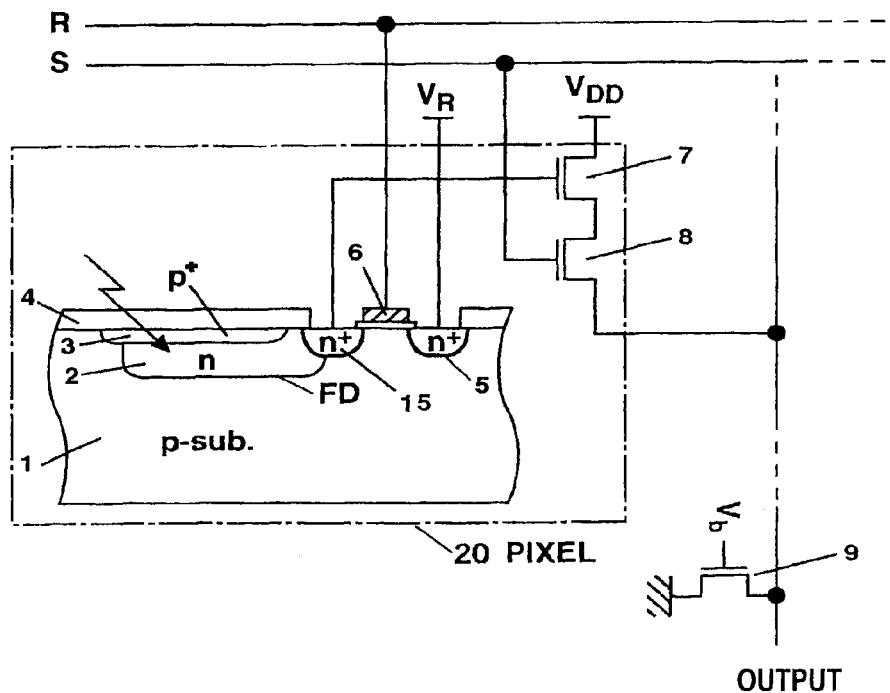
FIG. 2 is a view showing an example (conventional technique 2) of a pixel structure where pinning is partially executed in holes.

Reference numeral 1 in the drawings indicates a p-type semiconductor silicon substrate, reference numeral 2 indicates a charge storage region (n-type region), reference numeral 3 indicates a p-type region, reference numeral 4 indicates a silicon oxide film, reference numeral 5 indicates an n+ region, reference numeral 6 indicates a gate electrode, reference numeral 7 indicates a buffer transistor, reference numeral 3 indicates a pixel select transistor, reference numeral 9 indicates a current supply transistor, reference numeral 10 indicates an initializing transfer transistor, reference numeral 11 indicates a low concentration p-layer, reference numeral 12 indicates a hole-pinning region, reference numeral 13 indicates a p-channel MOS transistor, reference numeral 14 indicates a floating electrode, and reference numeral 15 indicates a floating diffusion.

DETAILED DESCRIPTION OF THE INVENTION

In the present invention, an n-type region as a charge storage region of a photodiode is buried into a substrate made of p-type semiconductor silicon, and a signal is extracted from the n-type region, without any contact, by capacitive coupling. The n-type layer of high concentration does not exist in the n-type region. Then, it is possible to perfectly deplete the n-type region at the time of resetting of the n-type region and temporally extract all electrons to another n-type region connected to a resetting power supply.

First Embodiment

Figure 3:
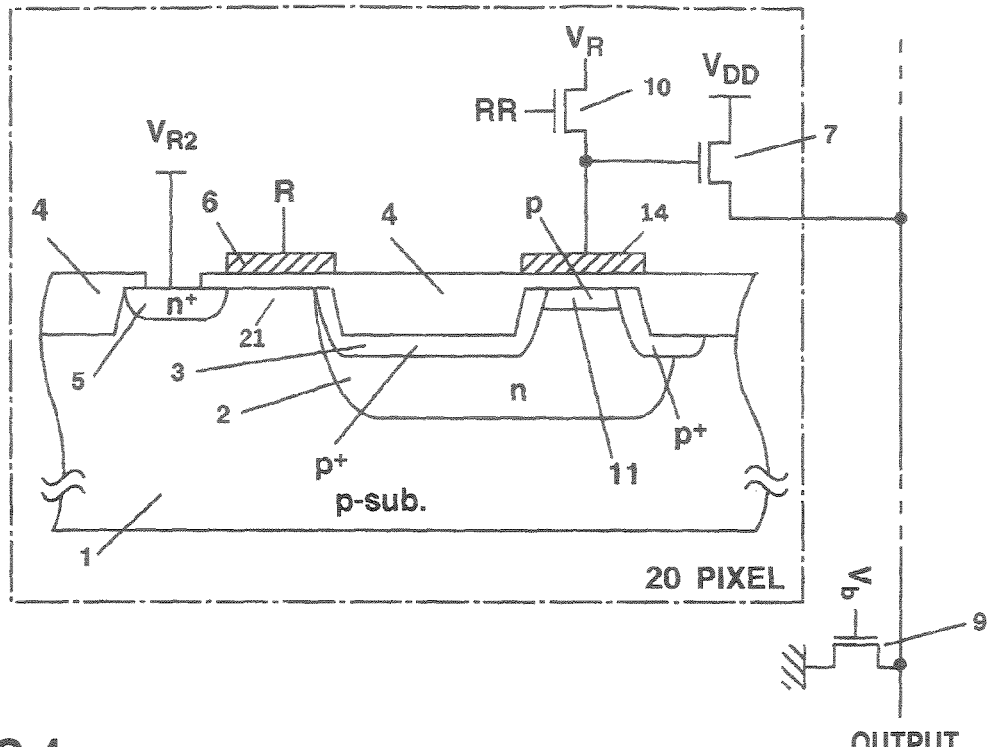
FIG. 3 is a view showing a pixel structure (p-layer formation) through a charge detection in the buried photodiode and a floating electrode.

FIG. 3 shows an example of its structure, which is based on architecture that directly detects the potential of the photodiode without transferring a signal charge; inside the pixel. The n-type region serving as a charge storage region (2) of the photodiode is buried in a substrate (1). The interface between a silicon and a silicon oxide film (4) is covered with a p-layer (3) of high concentration, and a p-layer (11) of a relatively low concentration is formed only in the portion immediately below a floating electrode (14) adapted for signal extraction. The electrons generated by light are stored in the n-type region serving as the charge storage region (2), and the potential of the portion of the p-layer (11) at the surface of the semiconductor region is changed thereby. The change in the potential is transmitted through a thin insulating film to the floating electrode (14) in a floating state by the capacitive coupling. The change in the potential of the floating electrode (14) is read out from the source follower circuit implemented by the buffer transistor (7) and the current supply transistor (9) provided outside the pixel array. The initialization of charges is executed by adding a positive high voltage to the gate electrode (6) of a first transfer transistor (21) by a control signal R. Here, the pixel according to the present invention is manufactured such that all of the electrons stored in the charge storage region (2) implemented by the n-type semiconductor region of the photodiode can be transferred to the n+ region (5). Thus, the generation of the reset noise can be protected.

In the p-layer (11) of the relatively low concentration in the portion immediately below the floating electrode (14), the concentration and depth of the p-type region is preferably set such that holes are induced on the p-layer semiconductor surface by the voltage applied to the floating electrode, and when the carriers generated by the light are initialized, the potential of the floating electrode is greatly changed dependency of the amount of the stored electrons.

Moreover, at the time of the signal storage, the concentration and depth of the p-type region are elected so as to induce holes (or electrons) in the semiconductor surface layer under the floating diffusion, even when the potential of the floating electrode is 0 V. so that the dark current can be reduced.

The concentration of the p-type region is experimentally determined. However, if the concentration of the p-type region is high, it is easy to fill the semiconductor surface with holes, and on the other hand, it is hard to supply the potential of the n-layer to the floating electrode. If the concentration of the p-type region is low, although it is easy to supply the potential of the n-layer to the floating electrode, it is difficult to fill the semiconductor surface with holes. As for the depth of the p-type region, if this is excessively deep, although it is hard to supply the potential of the n-layer, it is easy to fill the semiconductor surface with holes, and if the depth of the p-type region is excessively shallow, the result is opposite to the deep case.

The carrier density and carrier mobility are ascribable to those facts, and further, the initialization voltage of the floating electrode and the pulse width and cycle of the control signal may have influence on those facts. The concentration of the p-type region is preferred to be set between $10^{15}$ and $10^{18}$, and the depth of the p-type region should be experimentally determined at each of the elected concentrations.

In the case of the detection using the floating diffusion, in order to connect the potential of the floating diffusion to the gate of the readout MOS transistor, the n-type diffusion layer of high concentration is required as the floating diffusion. However, in the case of configuration shown in FIG. 3, since the potential of the n-type region is detected by the floating electrode (14) through an insulator (silicon oxide film), the n-type region of high concentration is not required. This leads to two merits. One merit lies in the structure where the n-type region can be perfectly depleted when the stored charges are scheduled to be initialized, because the diffusion layer of high concentration is not formed. The other merit lies in the situation such that, by applying 0 V or a slight negative voltage (for example, −0.3 V) to VR, because the entire surface of the n-type region of the photodiode can be filled with holes, the dark current can be decreased.

Figure 4:
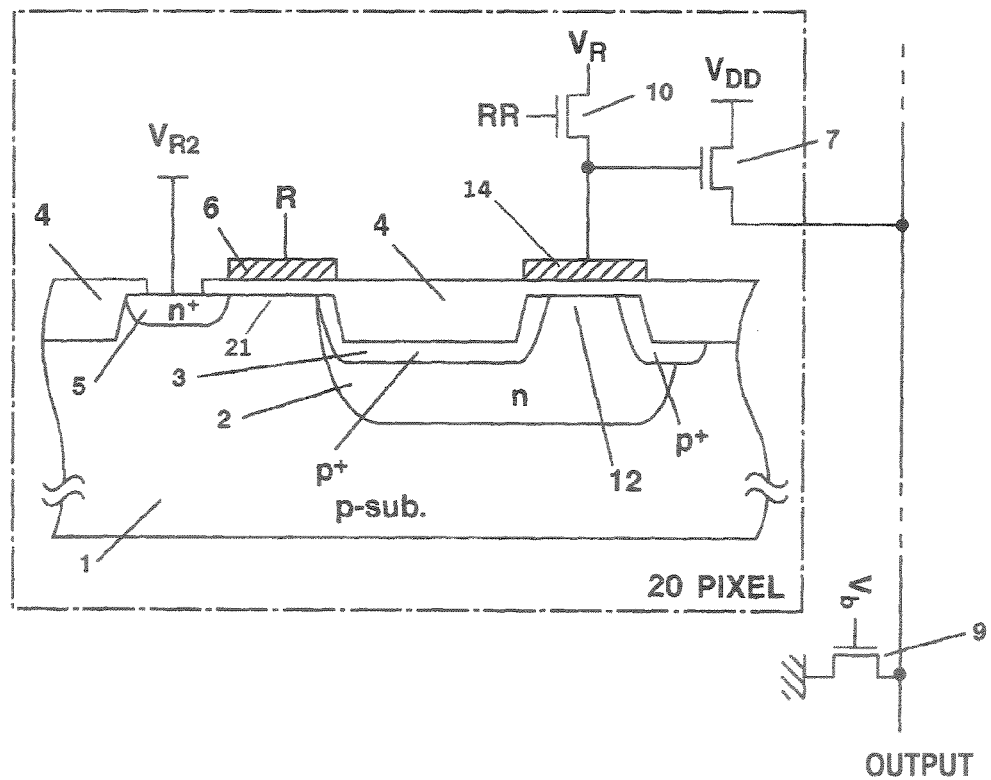
FIG. 4 is a view showing a pixel structure through the charge detection in the buried photodiode and the floating electrode.

Also, as shown in FIG. 4, another approach, in which the p-layer immediately below the floating electrode shown in FIG. 3 is omitted, is also provided. In FIG. 4, a region assigned at the surface of the n-type semiconductor region is defined as the hole-pinning region (12). In the configuration shown in FIG. 4, holes are induced in the hole-pinning region (12), while the charges generated by the light are stored in the n-type region, by using the floating electrode (for example, by using p$^+$ doped poly-silicon) having a work function so elected that holes can be accumulated in the hole-pinning region (12), even in the case that 0 V or a small negative voltage is applied to VR.

Figure 5:
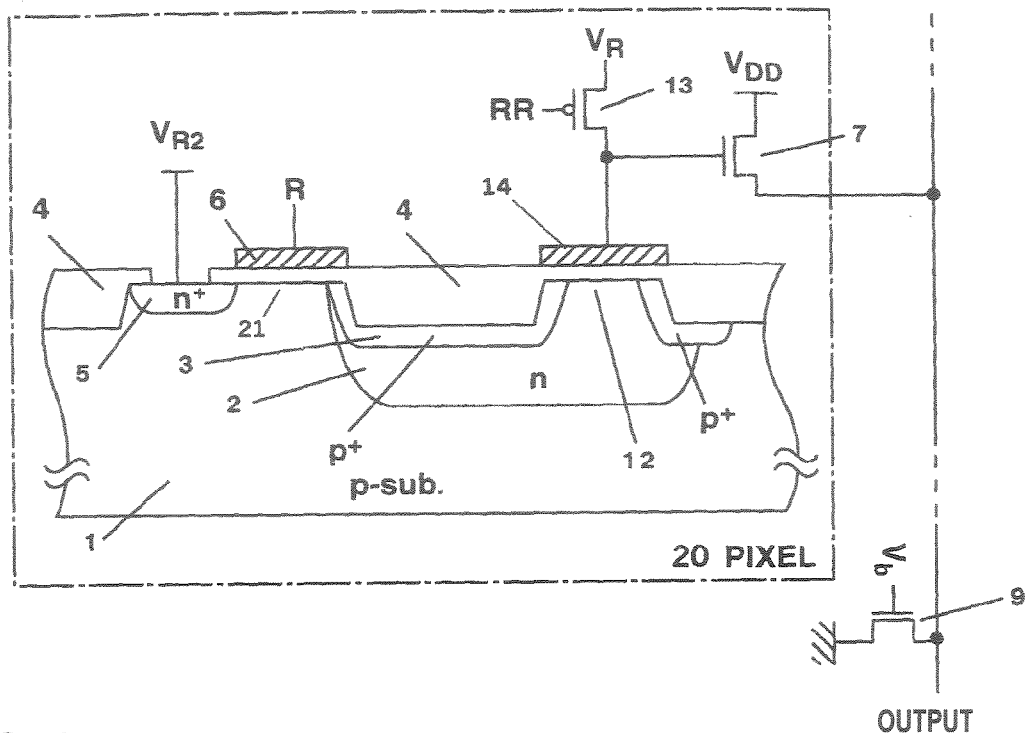
FIG. 5 is a view showing a pixel structure (a part of a p-channel MOS transistors is used) through the charge detection in the buried photodiode and the floating electrode.

Moreover, as shown, in FIG. 5, in order to hold the voltage of the floating electrode at a relatively large negative voltage when the charges are stored, a still another approach of using a p-channel MOS transistor (13) is also provided. In the case of using the p-channel MOS transistor, the negative voltage as VR can be employed, thereby applying the negative voltage to the floating electrode. However, in that case, in order to turn on the p-channel MOS transistor (13), the negative voltage must be applied to RR.

Figure 6:
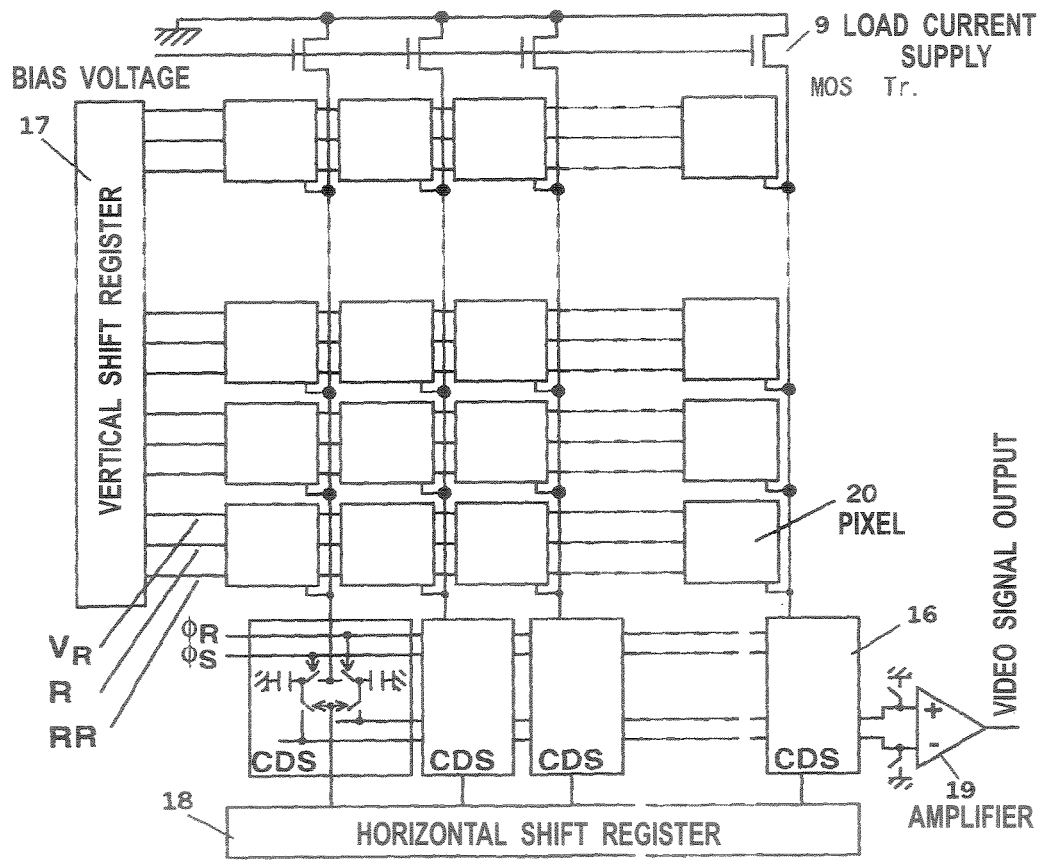
FIG. 6 is a view showing a configuration of an entire image sensor.
Figure 7:
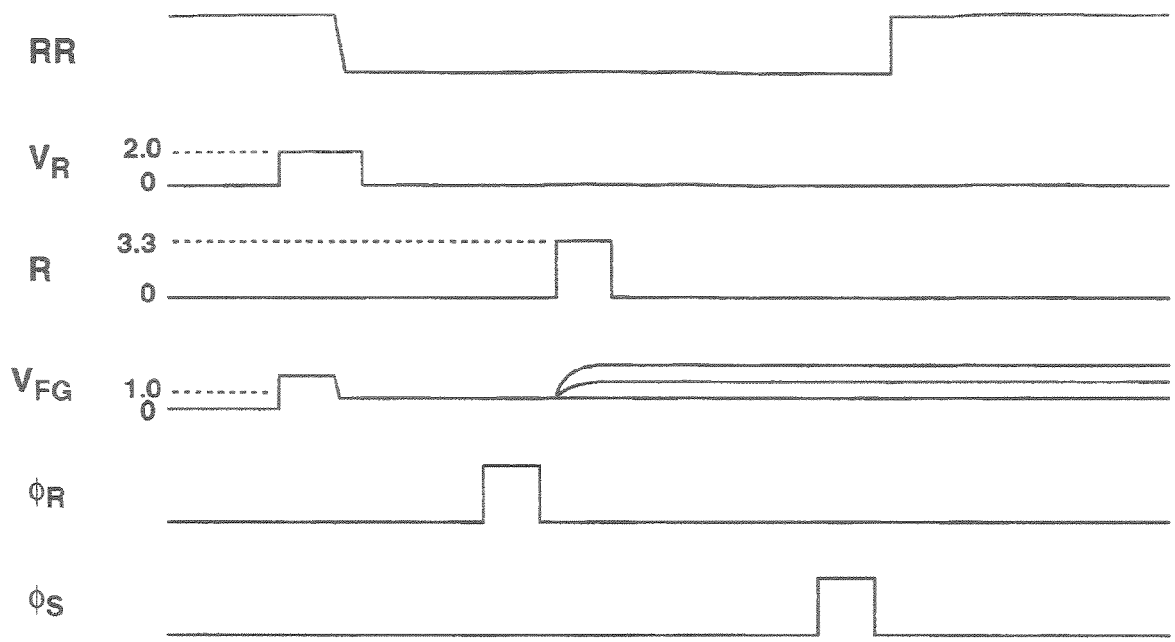
FIG. 7 is a view showing a readout operation timing in the structure of FIG. 3.

A concrete operation of the pixel shown in. FIG. 3, including the operation timing, will be described below. FIG. 6 shows an entire configuration example of the image sensor, in which a plurality of pixels (20), each having the structure shown in FIG. 3, are used. FIG. 7 is a timing chart showing an operation with regard to one horizontal row.

Let us suppose that, after the charges read out in the previous frame are reset, in the period until the read out based on FIG. 7 is carried out, the signal charges are being stored. At the period of the charge storage, the voltage VR is held at 0 V (or the slightly negative voltage), and holes are induced in the hole-pinning region (12) at the surface of the n-type semiconductor region, and kept at the pinning state. In order to read out, once the voltage VR is set to a high voltage of about 2 V, and the initial voltage of the voltage (VFG) of the floating electrode (14) is set. After that, RR is set to 0 V, and the second transfer transistor (10) is turned off, and the floating electrode (14) is consequently set at the floating state.

Figure 8:
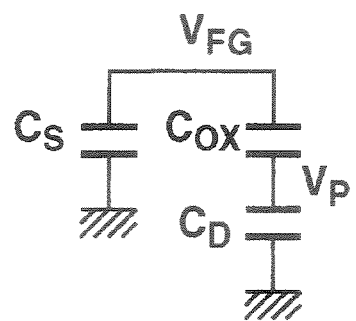
FIG. 8 is a view showing principle of a signal detection through a floating electrode.

The voltage VFG when the floating electrode (14) becomes the floating state is defined as VFGR. As for the level of VFGR, in a correlated double sampling circuit (CDS) (16) provided in each of the columns of the block diagram shown in FIG. 6, a reset level is sampled by a signal φR. After that, a reset signal R is given so as to open the gate of the first transfer transistor (21), and the electrons stored in a portion Vp are perfectly extracted out by the reset operation. At this time, the charge amount due to the stored electrons is defined as Qn. Consequently, although the potential distribution of the n-region inside the semiconductor is changed, its change is transmitted to the floating electrode side, and the potential of the floating electrode at this time is defined as VFGS. FIG. 3 shows a model diagram for analyzing this operation. In FIG. 8, Cox indicates the oxide film capacitance under the floating electrode, CD indicates the depletion layer capacitance, and Cs indicates the parasitic capacitance at the floating electrode. Although Cs and CD have voltage dependence characteristics, they are assumed to be constant for the purpose of simplification.

The voltages VFGS and VFGR are represented by the following equation:

[Equation 1]

$$V_{FGS}-V_{FGR}=C_{OX}Q_n/(C_S(C_D+C_{OX})+C_{OX}C_D) \quad (1)$$

As shown by above equation, the voltage change in the floating electrode is known to be approximately proportional to Qn. However, here, although the assumption that the depletion layer capacitance is not changed is used, the fact that the depletion layer capacitance will actually change must be considered. As can be understood from the equation (1), in order to make the sensitivity high, the parasitic capacitance at the floating electrode is required to be reduced. If the parasitic capacitance at the floating electrode can be tentatively reduced to the ignorable level, an equation (2) is established:

[Equation 2]

$$V_{FGS}-V_{FGR}=Q_n/C_D \quad (2)$$

Then, it is known that the floating electrode can directly detect the potential change inside the semiconductor that is caused by the storage of electrons.

The VFGS potential is sampled by applying, via the source follower circuit, φS to the CDS circuit (16) shown in FIG. 6. The difference voltage between the reset level and the signal level, which are stored in the capacitors in the CDS circuit, respectively, is obtained by a final stage amplifier through the horizontal scanning, and the difference voltage is outputted. A reference numeral 17 in FIG. 6 indicates a vertical shift register for scanning the pixel (20), and reference numeral 18 indicates a horizontal shift register for scanning the CDS circuit (16), and reference numeral 19 indicates an amplifier for obtaining the difference between the two outputs of the CDS circuit (16).

By the way, FIG. 8 shows only one configuration example. Because, various configurations can be used such as a configuration where a different circuit is used in the CDS circuit, or a configuration where an array of A/D converters is used in columns and the difference voltages are converted into digital signals so that the digital signals can be read out, the pixel circuit of the present invention does not limit those configurations of the peripheral circuit.

The pixel circuit configuration can be variously varied. For example, the pixel select transistor (8) may be added in series to the buffer transistor (7) for the source follower circuit, and the read-out selection of the pixels may be executed. The p-channel MOS transistor can be also used in the source follower circuit. Moreover, a configuration in which a depletion type transistor is used in the source follower circuit, and a pixel selecting MOS transistor is added in series to the depletion type transistor may be provided.

Also, FIGS. 3 to 5 show the case where the n-layer is formed on the p-substrate and the p-layer is formed at the surface of the n-layer. However, the reverse structure where the p-layer is formed on the n-substrate and the n layer is formed at the surface of the p-layer is naturally possible, and those structures are not excluded.

Moreover, the configurations shown in FIGS. 3 to 5 are illustrated under the assumption that shallow trench isolation (STI) structures are used as element isolation architectures. However, equivalent configurations can be naturally achieved with substantially similar structures, by employing other element isolation structures, for example, local oxidation of silicon (LOCOS) and the like.

Second Embodiment

Figure 9:
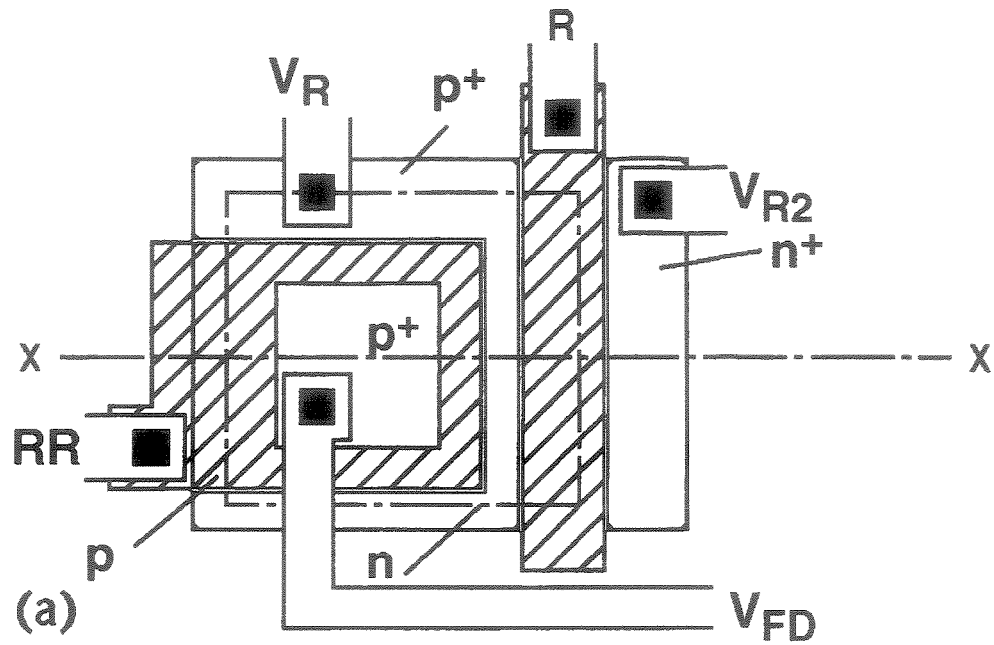
FIG. 9 is a view showing a pixel structure using a floating diffusion.
Figure 9:
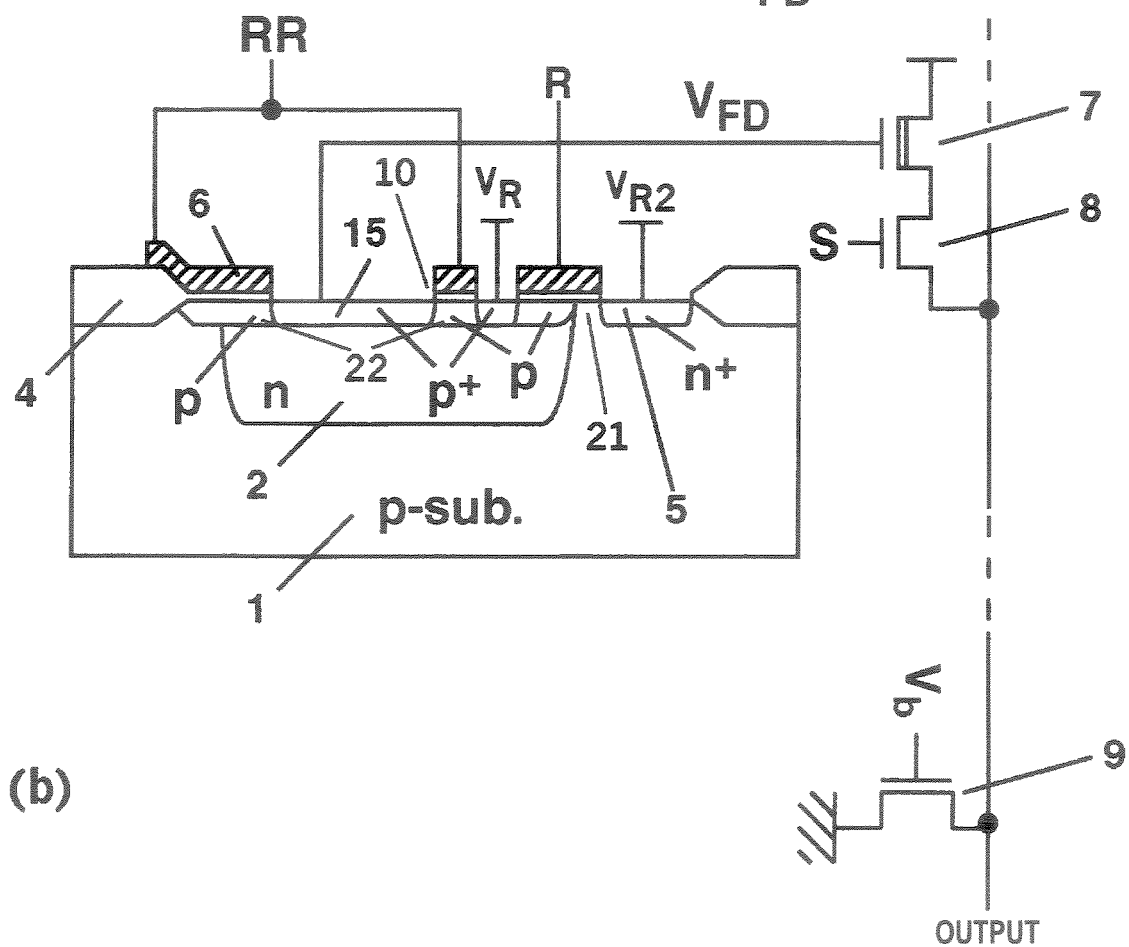

Instead of the above-explained floating electrode, architecture using a floating diffusion formed by doping impurities of the opposite polarity in the region disposed on the photodiode is explained. FIG. 9 shows its structure view. FIG. 9A is a top view, and FIG. 9B is a sectional view taken on line X-X. Let us suppose that the p-type substrate (1) is connected to 0 V. A first transfer transistor (21) encompasses a gate electrode provided above an interface between a charge storage region (2) and an $n^+$ region (5). A second transfer transistor (10) encompasses a gate electrode (6) provided above a p-layer (22) of low concentration. Although the $p^+$ region, to which the potential VR is applied, is illustrated as if the $p^+$ region surrounds the periphery of the gate electrode (6), there is an empty space where the $p^+$ region is not arranged on a part, which is ascribable to a manufacturing process.

Figure 10:
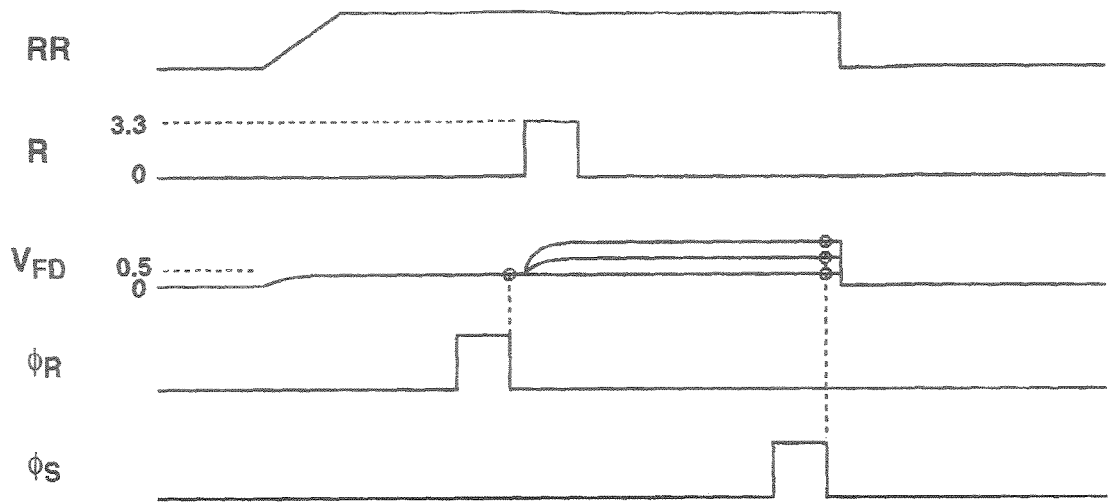
FIG. 10 is a view showing the readout, operation timing in the structure of FIG. 9.

FIG. 10 shows the readout operation timing. When 0 V or negative voltage is applied to RR connected to the gate electrode of the second transfer transistor (10) and to R connected to the gate electrode of the first transfer transistor (21), holes are induced at the surfaces of the semiconductor regions immediately below these gate electrodes and the gates are conducted. Thus, the potential of the central floating diffusion (15) becomes VR. Consequently, the interface states at the interface between the silicon and the silicon oxide film are filled with holes. Thus, since the electrons are not generated, the generation of the dark current can be suppressed. Here, because the n-type region of the photodiode is perfectly buried in the substrate, the surface of the n-type region is filled with holes. The storage of the electrons generated by the light is carried out under such situation. Consequently, the generation of the dark current can be extremely reduced.

After that, the voltage of RR is made high. Consequently, the semiconductor region immediately below the gate electrode of the second transfer transistor (10) is depleted and the central p-type floating diffusion (15) is driven to the floating state. The voltage of the floating diffusion (15) at this time is defined as a first voltage level and is read out to outside. Next, a high voltage is applied to R, and all of the charges stored in the n-type region serving as the charge storage region (2) are transferred to the $n^+$ region (5) of a potential VR2. At this time, since the electrons are extracted from the n-type region serving as the charge storage region (2) to the $n^+$ region (5) serving as a drain, the potential of the n-type region serving as the charge storage region (2) is increased. In association with the increase of the potential of the charge storage region (2), the potential of the floated central p-type floating diffusion (15) is also increased. The change in the potential is read out through the buffer transistor (7). The read out potential is defined as the second voltage level. Then, the difference between the voltage level (first voltage level) of the central p-type floating diffusion when the p-type floating diffusion is driven to the floating state, while electrons are stored in the n-type region serving as the charge storage region (2) and the voltage level (second voltage level) of the p-type floating diffusion when the n-type region serving as the charge storage region (2) is depleted state, by extracting all of the electrons stored in the charge storage region (2) is read out to the outside from the pixel, and the difference is determined. Consequently, the fixed pattern noise and the reset noise in the pixel are removed, while providing the output, which is proportional to the signal charges.

In view of the potential value to be read out, a depletion type transistor where the threshold voltage has a negative value is employed for the buffer transistor (7) for reading out the potential of the floating diffusion (15) in the configuration shown in FIG. 9. Depending on the range of the potential, there is a case that an enhancement type transistor can be used. A pixel select transistor (8) configured to select the pixel to be read out, a current supply transistor (9) connected to a vertical signal line and a buffer transistor (7) implement a source follower circuit, by which the potential of the floating diffusion is read out, to a noise canceling circuit disposed in the column.

Figure 11:
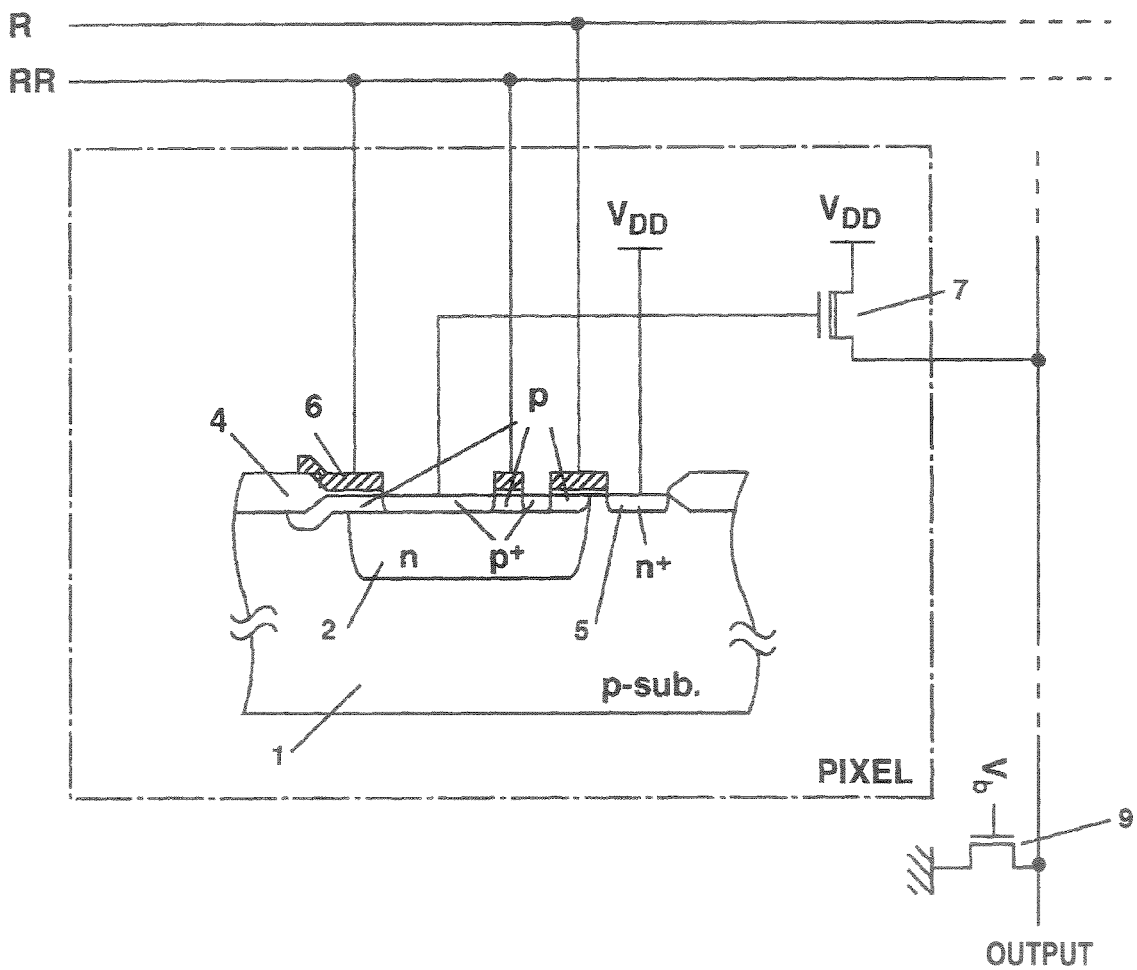
FIG. 11 is a view showing a pixel structure 2 using a floating double diffusion layer.

There is a case that the voltage level, when the central p-type floating diffusion is driven to the floating state, is increased to, for example, about 1 V, by injecting holes into the central p-type floating diffusion, if RR is set at a high voltage when the signal is read out. In such a case, as the read-out buffer transistor (7), an enhancement type transistor can be used, and the pixel select transistor (8) can be omitted. FIG. 11 shows an example where the pixel select transistor is omitted.

This corresponds to the situation that the pixel selection is carried out by RR. When the 0 V or negative voltage is applied to RR, because the potential of the central p-type floating diffusion is fixed to 0 V, the read-out buffer transistor (7) is driven to the cut-off state. When a high voltage is applied to RR, the potential of the p-type floating diffusion will increase to a level by which the source follower circuit, implemented by the buffer transistor (7) in the combination with the current supply transistor (9), can read out the potential of the p-type floating diffusion.

Since the configuration of the entire image sensor is similar to FIG. 6, the illustration of the entire image sensor is omitted. Here, the case where the n-layer is formed on the p-substrate and the p-layer is formed at the surface of the n-layer is presented as an example. However, the opposite structure where the p-layer is formed on the n-substrate and the n-layer is formed at the surface of the p-layer is naturally possible, and therefore, those structures are not excluded.

Third Embodiment

Figure 12:
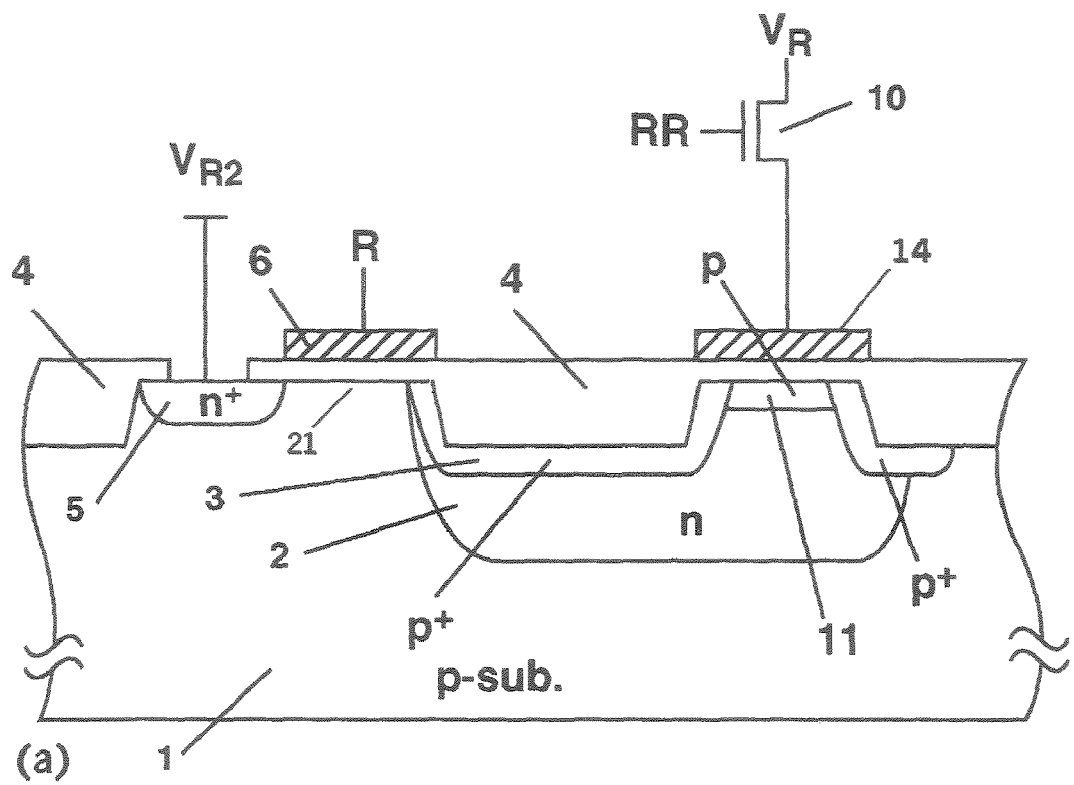
FIG. 12 is a view showing an overflow of stored charges.
Figure 12:
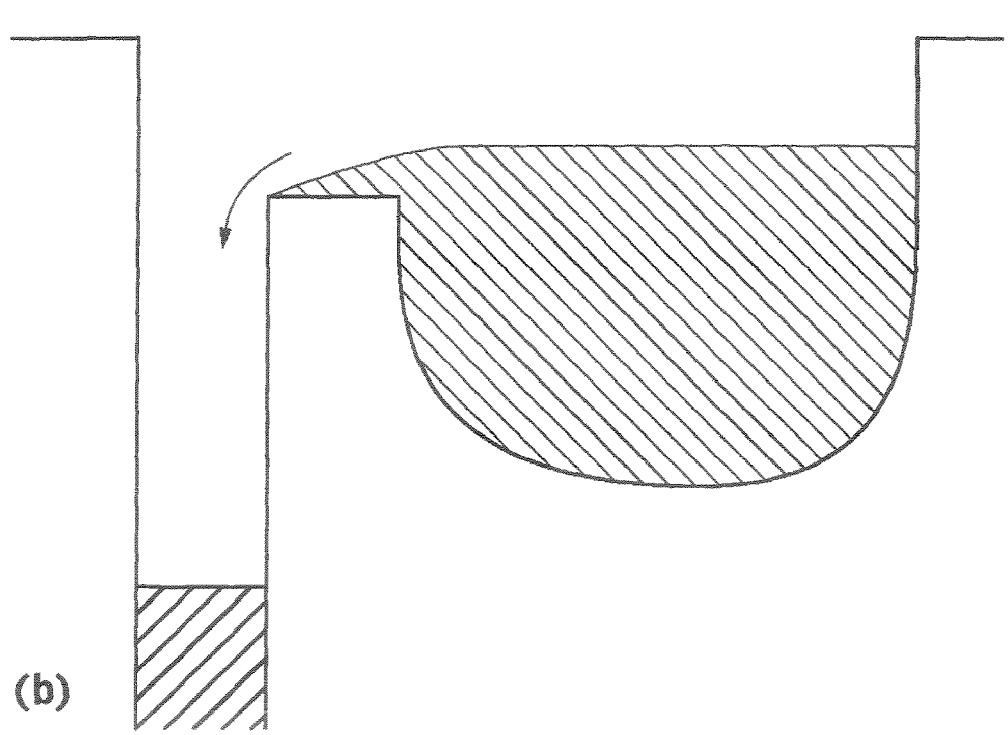
Figure 13:
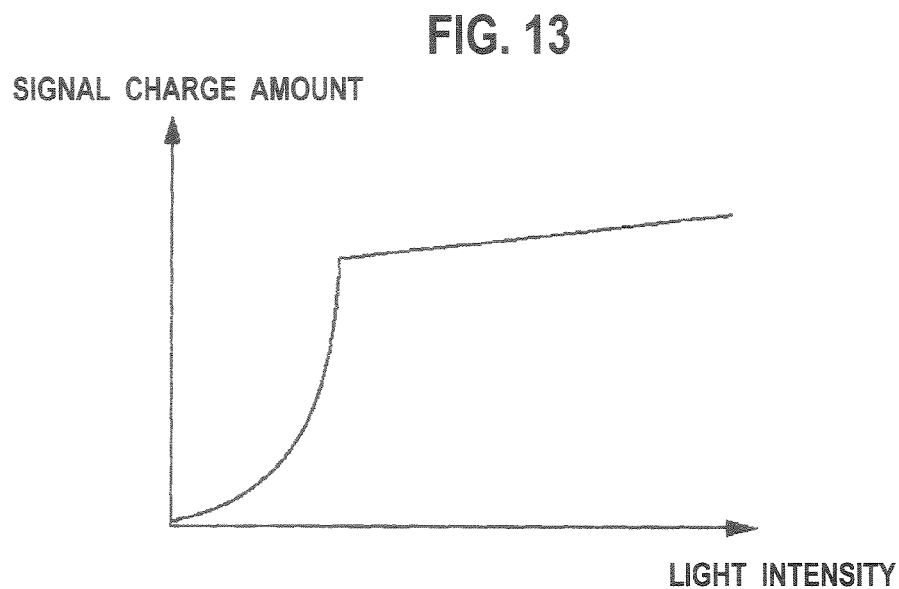
FIG. 13 is a view showing an stored charges amount for an incident light intensity (logarithm).

In the pixel device of the present invention, overflow characteristics of the stored charges is used, which can obtain an image with wide dynamic range. FIG. 12 shows the overflow of the stored charges: FIG. 12A shows the sectional view of the pixel (20) similarly to FIG. 3, and FIG. 12B shows the potential along with the position corresponding to the sectional view. As shown in FIG. 12B, when there is the very strong incident light, under the situation that the reset signal R is set to 0 V, the charges stored in the photodiode exceeds its capacity, and exceeds the reset gate potential of the first transfer transistor (21) so as to overflow into the $n^+$ region (5) serving as the drain. Under the situation, although the increase of the charges in the charge storage region (2) is suppressed, the increase is not suppressed at all, and as shown in FIG. 13, the charges will increase logarithmically with the incident light intensity. In FIG. 13, abscissa is logarithmically represented in order to easily indicate the increase of the charges. For this reason, in the overflow regime, the charges are gradually increases with a small inclination. In short, in the regime where the charges overflow, the stored charges and the read out signal voltage, which is proportional to the charges, logarithmically increase with the light intensity in a very wide range. Therefore, by reading out the signal voltage, under the condition that the logarithmic response regime is included, an video signal having a wide dynamic range can be obtained.

The charge amount that brings about this overflow can be controlled on the basis of the potential of the reset signal R held at the period of the charge storage, and the potential of the reset signal R may be set to about 1.0 V so as to make the overflow easy. Also, it is possible to control the potential of the reset signal R at the period of the charge storage, on the basis of the average brightness or maximum brightness of the image.

Figure 14:
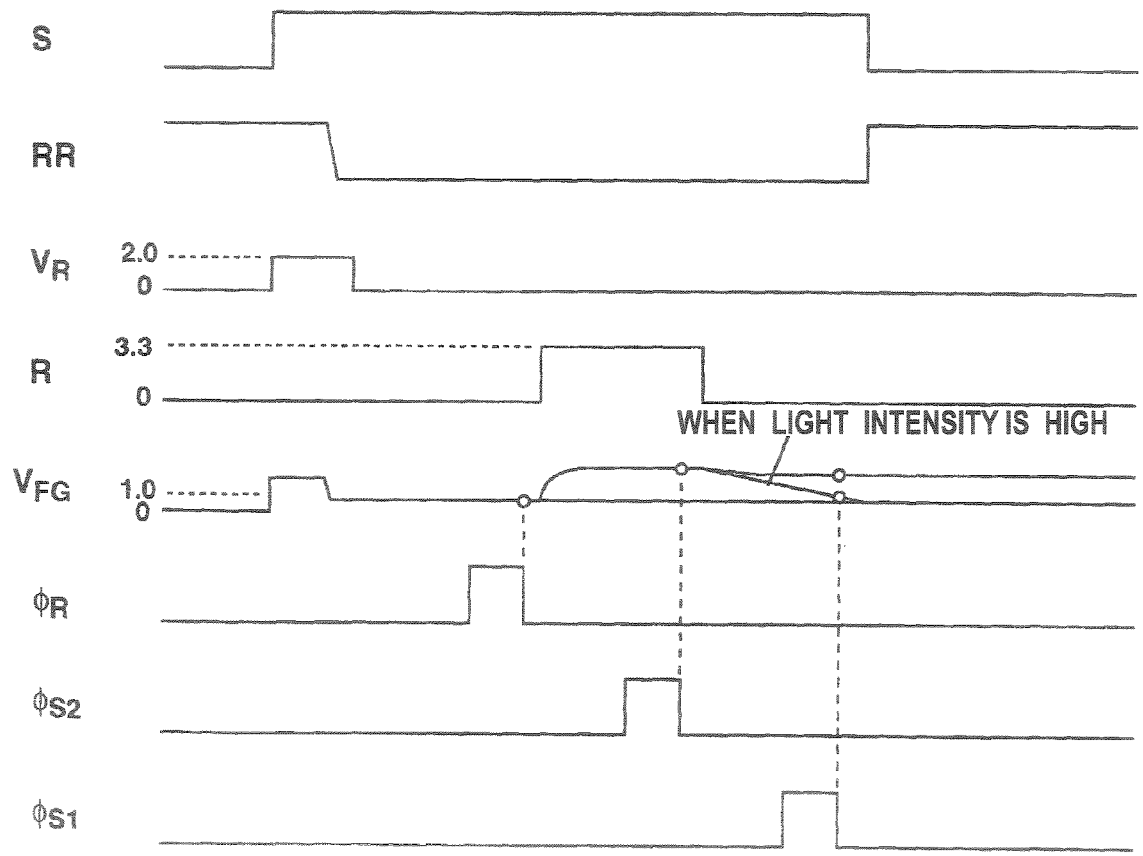
FIG. 14 is a view showing an operation timing to avoid a black inversion at a time of a high brightness.

By the way, at this time, attention should be paid to the fact that when the incident light intensity is very high, if the high voltage is applied to the reset signal R and the charges are initialized, and then reverse the signal R to 0 V so that the sampling can be executed so as to read out the signal, the charges will be stored in the photodiode in a short time so that the reset level is changed. Then, when the difference between the reset level and the signal level is calculated, the difference becomes small, which results in the reversal of the bright/dark relation. In short, the very bright area becomes black. In order to avoid the reversal of the bright/dark relation, as indicated in the timing diagram shown in FIG. 14, a sampling control signal φS2 is used, and a signal in which the reset signal R is still high is stored in a different sample-and-hold circuit provided in the column of FIG. 6, and as for the very bright signal, the difference between the signal sampled by φS2 and the signal sampled by φR is calculated so as to provide an output. Also, as for the signal in the normal linear regime, similarly to FIG. 7, the difference between the signals sampled by φR and φS1 is determined so as to provide the output. Finally, they are synthesized to generate the video signal having the wide dynamic range. The process for synthesizing them may be carried out in an analog process on the image sensor or may be carried out in a digital process after the AD conversion. Or, after the output signals are read out to outside of the image sensor, the synthesizing process may be executed by hardware or software.

INDUSTRIAL APPLICABILITY

With the above-mentioned configurations, it is possible to achieve an image sensor, which has low noise, small dark current and high sensitivity.

The invention claimed is:

1. An image sensor having a plurality of unit pixels arranged one-dimensionally or two-dimensionally, each of the unit pixels comprising:
a buried photodiode comprising a charge storage region including a buried portion and a protruding portion connected to the buried portion, the protruding portion having an upper end lying higher than the buried portion;
an insulator having a thick portion disposed above the buried portion, the thick portion configured to bury the protruding portion under the thick portion, and a thin portion disposed on the upper end of the protruding portion;
a floating electrode selectively disposed on the thin portion of the insulator, capacitively coupled to the protruding portion of the charge storage region of the photodiode through the thin portion of the insulator, and configured to be driven into a floating state;
a first transfer transistor connected to the charge storage region of the photodiode configured to extract and initialize carriers, which are generated by light and stored in the charge storage region;
a second transfer transistor connected between the floating electrode and a power supply at an initialization potential, the power supply configured to apply the initialization potential to the floating electrode; and
a buffer transistor having a gate electrode connected to the floating electrode, configured to read out a potential of the floating electrode.

2. The image sensor of claim 1, wherein the photodiode comprises:
a first conductivity type semiconductor substrate;
a second conductivity type semiconductor region disposed on the substrate, serving as the charge storage region having the buried portion and the protruding portion; and
a first conductivity type region disposed at a surface of the second conductivity type semiconductor region so that the second conductivity type semiconductor region is buried under the first conductivity type region, wherein
the first conductivity type region is not formed on the upper end of the protruding portion of the second conductivity type semiconductor region,
the floating electrode is provided above the second conductivity type semiconductor region at a location where the first conductivity type region is not formed, via the thin portion of the insulator formed on the location, and
the first conductivity type is opposite in polarity to the second conductivity type.

3. The image sensor of claim 2, wherein the photodiode further comprises:
a minority-carrier-inducing region of the first conductivity type disposed below the floating electrode at the upper end of the protruding portion of the second conductivity type semiconductor region, a concentration and a depth of the minority-carrier-inducing region are selected so that a voltage applied to the floating electrode can induce minority carriers at the surface of the minority-carrier-inducing region, and when the carriers generated by light are initialized, the potential of the floating electrode is changed depending on the amount of the stored majority carriers in the second conductivity type semiconductor region.

4. The image sensor of claim 3, wherein the concentration and the depth of the minority-carrier-inducing region is so elected such that, in a period of signal storage, even if the potential of the floating electrode is 0 V, the minority carriers are induced at the surface of the minority-carrier-inducing region below the floating electrode.

* * * * *